(12) United States Patent
Sato et al.

(10) Patent No.: US 12,006,566 B2
(45) Date of Patent: Jun. 11, 2024

(54) COMPOSITE TUNGSTEN OXIDE FILM AND METHOD FOR PRODUCING SAME, AND FILM-DEPOSITED BASE MATERIAL AND ARTICLE EACH PROVIDED WITH SAID FILM

(71) Applicant: SUMITOMO METAL MINING CO., LTD., Tokyo (JP)

(72) Inventors: Keiichi Sato, Tokyo (JP); Isao Ando, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 670 days.

(21) Appl. No.: 17/252,936

(22) PCT Filed: Jun. 6, 2019

(86) PCT No.: PCT/JP2019/022481
§ 371 (c)(1),
(2) Date: Dec. 16, 2020

(87) PCT Pub. No.: WO2019/244650
PCT Pub. Date: Dec. 26, 2019

(65) Prior Publication Data
US 2021/0147973 A1    May 20, 2021

(30) Foreign Application Priority Data

Jun. 20, 2018 (JP) ................................. 2018-117340
Feb. 14, 2019 (JP) ................................. 2019-024926

(51) Int. Cl.
*C23C 14/08* (2006.01)
*C01G 41/00* (2006.01)
(Continued)

(52) U.S. Cl.
CPC .......... *C23C 14/083* (2013.01); *C01G 41/006* (2013.01); *C03C 17/245* (2013.01);
(Continued)

(58) Field of Classification Search
CPC .............. C23C 14/083; C23C 14/3414; C23C 14/5806; C01G 41/006; C03C 17/245;
(Continued)

(56) References Cited

U.S. PATENT DOCUMENTS

| 3,505,108 A | 4/1970 | Mochel |
| 6,040,939 A | 3/2000 | Demiryont et al. |
| 2015/0153478 A1* | 6/2015 | Takeda .................... H01B 1/20 |
| | | 427/126.3 |

FOREIGN PATENT DOCUMENTS

| CN | 108018532 A | 5/2018 |
| JP | H05-113085 A | 5/1993 |

(Continued)

OTHER PUBLICATIONS

Ahsan et al. "Low temperature response of nanostructured tungsten oxide thin films toward hydrogen and ethanol" Sensors and Actuators B: Chemical vol. 173, Oct. 2012, pp. 789-796 (Year: 2012).*

(Continued)

*Primary Examiner* — Alicia J Weydemeyer
*Assistant Examiner* — Laura B Figg
(74) *Attorney, Agent, or Firm* — Oliff PLC

(57) ABSTRACT

A composite tungsten oxide film having high film smoothness, with a function to shield infrared light by reflecting infrared light by a thermal insulation, while maintaining transparency in a visible light region, and a method for manufacturing the composite tungsten oxide film, and a film-deposited base material or an article using these functions. A composite tungsten oxide film including a composition with a general formula $M_xW_yO_z$ as main components, (Continued)

wherein $0.001 \leq x/y \leq 1$, $2.2 \leq z/y \leq 3.0$, organic components are not contained substantially, a transmittance in a wavelength of 550 nm is 50% or more, a transmittance in a wavelength of 1400 nm is 30% or less, and also, a reflectance in a wavelength of 1400 nm is 35% or more.

21 Claims, 2 Drawing Sheets

(51) Int. Cl.
    *C03C 17/245*     (2006.01)
    *C23C 14/34*     (2006.01)
    *C23C 14/58*     (2006.01)

(52) U.S. Cl.
    CPC ...... *C23C 14/3414* (2013.01); *C23C 14/5806* (2013.01); *C01P 2002/54* (2013.01); *C01P 2002/74* (2013.01); *C01P 2002/76* (2013.01); *C01P 2006/40* (2013.01); *C01P 2006/60* (2013.01); *C01P 2006/90* (2013.01); *C03C 2218/154* (2013.01); *C03C 2218/32* (2013.01)

(58) Field of Classification Search
    CPC ........... C03C 2218/154; C03C 2218/32; C01P 2002/54; C01P 2002/74; C01P 2002/76; C01P 2006/40; C01P 2006/60; C01P 2006/90

See application file for complete search history.

(56) References Cited

FOREIGN PATENT DOCUMENTS

| JP | H08-12378 A | 1/1996 |
|---|---|---|
| JP | 2002-020142 A | 1/2002 |
| JP | 2006-096656 A | 4/2006 |
| JP | 2006-347807 A | 12/2006 |
| JP | 4096205 B2 | 6/2008 |
| JP | 2010-180449 A | 8/2010 |
| KR | 10-2015-0088551 A | 8/2015 |
| WO | WO2017/159790 A1 | 2/2019 |
| WO | 2019/058737 A1 | 3/2019 |

OTHER PUBLICATIONS

Xin et al.; "Two-step fabrication of Na$_x$WO$_3$ thin film via oxygen-vacancy-induced effect for energy efficient applications;" Crystengcomm; 2017; pp. 3931-3938; vol. 19.

Aug. 3, 2021 Extended Search Report issued in European Patent Application No. 19822399.2.

Aug. 13, 2019 Search Report issued in International Patent Application No. PCT/JP2019/022481.

\* cited by examiner

COMPOSITE TUNGSTEN OXIDE FILM AND METHOD FOR PRODUCING SAME, AND FILM-DEPOSITED BASE MATERIAL AND ARTICLE EACH PROVIDED WITH SAID FILM

BACKGROUND OF THE INVENTION

Field of the Invention

The present invention relates to a composite tungsten oxide film and a method for producing same, and further, relates to a film-deposited base material provided with the composite tungsten oxide film and an article utilizing a function of the composite tungsten oxide film. This application is based upon and claims the benefit of priority from Japanese Patent Application No. 2018-117340 filed on Jun. 20, 2018 in Japan, and Japanese Patent Application No. 2019-24926 filed on Feb. 14, 2019 in Japan, which are incorporated by reference herein.

Description of Related Art

As a light-shielding member used for window materials or the like, various materials are proposed. For example, in Patent Literature 1, as a light-shielding member of a window or the like, a light-shielding member of a film having a mirror surface state formed by a vapor deposition of a metal such as aluminum, is described. In addition, there is a light-shielding member of a film formed by sputtering silver or the like. However, when this type of light-shielding member is used, it will have a half mirror appearance, so a reflection is too bright to be used at outside, and it will be an issue for view. On the other hand, the light-shielding member utilizing a reflection is generally having a characteristic that it is also having a thermal insulating property by also reflecting far infrared rays. The reflection of light by the light-shielding member including far infrared rays is caused by an action of free electrons.

In contrast, the present applicant has proposed an infrared shielding fine particle dispersion having composite tungsten oxide fine particles described in Patent Literature 2. The composite tungsten oxide fine particles efficiently absorb solar rays, especially a light of near-infrared region, and also, having high transparency with respect to a visible light. In the invention relating to Patent Literature 2, the composite tungsten oxide fine particles are dispersed in an appropriate solvent to prepare a dispersion liquid, a medium resin is added into the obtained dispersion liquid, and then the dispersion liquid is coated onto a surface of a base material to form a thin film, and it is having extremely high heat shielding property. The infrared shielding fine particle dispersion shows high heat shielding property by an effect of having an excellent light absorbing property, but hardly having a reflecting property, so a thermal insulating property cannot be expected much.

In Patent Literature 3, a composite tungsten oxide film manufactured by applying a solution containing raw material compounds of composite tungsten oxide on a substrate, and then, by heat-treating the substrate, is disclosed. A part of films disclosed in Patent Literature 3 is having a reflectance of about 30% in a wavelength of 1400 nm as illustrated in FIG. 2 and FIG. 3 of Patent Literature 3, so a thermal insulating property is also expected to some extent.

In addition, in Patent Literature 4, a $Na_xWO_3$ film deposited by using a centrifugal force of a rotating substrate by dropping a solution containing raw material compounds of composite tungsten oxide onto the rotating substrate, and then, fired in a reducing atmosphere, is disclosed. According to FIG. 1 of Patent Literature 4, the $Na_xWO_3$ film reflects most of light in infrared region and it is considered to have both of a shielding property and a thermal insulating property.

On the other hand, such composite tungsten oxide film may be optically designed for the purpose of a prevention of a reflection, an adjustment of a color tone, and the like, but a film thickness of a film laminated at this time is extremely thin as few nm to few hundreds nm. Therefore, it is necessary to control a film thickness of the composite tungsten oxide film to be less than 100 nm, but it is difficult to control a film thickness to be in a region less than 100 nm by a coating method. In addition, a surface roughness of the composite tungsten oxide film to be laminated is required to be smooth, and if a surface roughness of a deposited film surface is large, a desired effect of the optical design cannot be obtained. In a coating and firing method described in Patent Literature 3 and Patent Literature 4, from a process that a crystal is precipitated from a solution and crystal particles will be grown, a surface roughness tends to be large. When the method described in Patent Literature 3 was reproduced and a surface roughness of the film was measured by a laser microscope, the surface roughness was more than 60 nm in an arithmetic mean height Sa.

As other means for obtaining such composite tungsten oxide thin film, there are physical methods such as a sputtering method and a deposition method as can be seen in examples of Patent Literature 1. A thin film deposited by a physical film deposition method can be a film excluding elements other than the aimed composition. In addition, it does not need to use a medium resin or a dispersing agent which are not suitable for high temperature treatment, so it can be used for a manufacturing process of, for example a reinforced glass, which is heat-treated at high temperature. Further, a film thickness of the thin film deposited by a physical film deposition method can be controlled easily, even in a film thickness less than 100 nm, and also, an extremely smooth surface of few nm or less in an arithmetic mean roughness can be produced, so the thin film can be easily formed to be a laminated structure.

In Patent Literature 5, a window glass for a vehicle and a method for manufacturing same is proposed, and a large size inline type sputtering device capable of treatment to a large area substrate of a window for a vehicle and the like is used. When such manufacturing equipment can be used, a film with stably high quality and with uniform film thickness can be obtained easily, also with high productivity. In addition, a source of film deposition in a physical film deposition method (for example, a target material in a sputtering method) may not be a single compound, and for example, it may be a mixture composed of a plurality of compounds or a combination of compositions of single element, so a degree of freedom in a selection of composition is extremely high.

In Patent Literature 6, a composite tungsten oxide film prepared by a sputtering method is proposed. A composite tungsten oxide film, which is composed of tungsten and at least one type of elements selected from a group consisting of IVa group, Ma group, VIIb group, VIb group and Vb group in the periodic table, is formed on a glass substrate. However, the oxide film with this composition is not having a sufficient heat ray shielding performance as an infrared transmittance is 40% or more, and there was an issue that it does not exert its function unless it is configured as a multi-layer film with other transparent dielectric film.

Patent Literature 1: JP H5-113085 A
Patent Literature 2: JP 4096205 B
Patent Literature 3: JP 2006-096656 A
Patent Literature 4: U.S. Pat. No. 3,505,108 A
Patent Literature 5: JP 2002-020142 A
Patent Literature 6: JP H8-12378 A

SUMMARY OF THE INVENTION

As mentioned above, it still cannot be said that a heat ray shielding performance of a composite tungsten oxide film by the physical film deposition method is sufficient. On the other hand, a film formed by a coating method is having high function for shielding heat rays by absorbing light, but a thermal insulating property cannot be expected much. In addition, there is an issue that a smoothness of the film is inferior.

Here, the present invention is invented to solve such circumstances, and a purpose of the present invention is to provide a composite tungsten oxide film having high film smoothness, in addition to a function to shield infrared light by reflecting infrared light, in other words, a heat ray shielding function by a thermal insulation, while maintaining a transparency in a visible light region, and a method for producing the composite tungsten oxide film, and further, to provide a film-deposited base material or an article using these functions.

As a result of keen examination about a composite tungsten oxide film with respect to the above problems, the inventors have achieved to obtain a composite tungsten oxide film having an extremely smooth film, and also, exerting a thermal insulating function by reflecting infrared rays, while maintaining an excellent visible light transmissivity, by optimizing a condition at the time of film deposition by a physical film deposition method.

In other words, one embodiment of the present invention is a composite tungsten oxide film comprising a composition represented by a general formula $M_xW_yO_z$ (wherein, an element M is one or more elements selected from alkaline metal, alkaline earth metal, Fe, In, Tl, and Sn, an element W is tungsten, and an element O is oxygen) as main components, wherein $0.001 \leq x/y \leq 1$, $2.2 \leq z/y \leq 3.0$, organic components are not contained substantially, a transmittance in a wavelength of 550 nm is 50% or more, a transmittance in a wavelength of 1400 nm is 30% or less, and also, a reflectance in a wavelength of 1400 nm is 35% or more.

According to one embodiment of the present invention, a composite tungsten oxide film having a function to shield infrared light by reflecting infrared light, in other words, a heat ray shielding function by a thermal insulation, while maintaining a transparency in a visible light region, is achieved.

At this time, in one embodiment of the present invention, a surface roughness Sa may be 20 nm or less.

By satisfying the above condition, the composite tungsten oxide film having high film smoothness is achieved.

In addition, in one embodiment of the present invention, a sheet resistance may be less than $10^5$ ohms per square.

By configuring the sheet resistance to be in the above range, more preferable thermal insulating property is obtained.

In addition, in one embodiment of the present invention, the composite tungsten oxide film may be derived from a spattering film deposition.

By being derived from the spattering film deposition, the composite tungsten oxide film capable of film deposition stably, and with an extremely wide freedom in a selection of compositions, is provided. In addition, by the spattering film deposition, an extremely smooth film is obtained, so an effect of optically designed laminated structure is improved.

In addition, in one embodiment of the present invention, the element M may be one or more elements selected from Cs, Rb, K, Tl, In, Ba, Li, Na, Ca, Sr, Fe and Sn.

By selecting the element M from the above elements, the composite tungsten oxide film having high film smoothness, in addition to a function to shield higher infrared rays by reflecting higher infrared rays, is achieved.

In addition, in one embodiment of the present invention, the composite tungsten oxide film may contain a hexagonal crystal structure.

A hexagonal crystal phase is having higher reflection in an infrared region, so it is reflected efficiently.

At this time, in one embodiment of the present invention, when an intensity ratio between a diffraction intensity I (200) of hexagonal (200) face and a diffraction intensity I (002) of hexagonal (002) face by X-ray diffraction using CuKα ray is I (002)/I (200), the I (002)/I (200) may be 0.30 or more and 0.50 or less, and a ratio c/a between a-axis and c-axis of hexagonal crystal by X-ray diffraction using CuKα ray may be 1.018 to 1.029.

By the composite tungsten oxide film satisfying the above requirements by X-ray diffraction analysis, the composite tungsten oxide film exerting a thermal insulating function by reflecting infrared rays, while maintaining an excellent visible light transmissivity, is achieved.

In addition, one embodiment of the present invention is a composite tungsten oxide film comprising a composition represented by a general formula $M_xW_yO_z$ (wherein, an element M is one or more elements selected from alkaline metal, alkaline earth metal, Fe, In, Tl, and Sn, an element W is tungsten, and an element O is oxygen) as main components, wherein $0.001 \leq x/y \leq 1$, $2.2 \leq z/y \leq 3.0$, the composite tungsten oxide film contains a hexagonal crystal structure, when an intensity ratio between a diffraction intensity I (200) of hexagonal (200) face and a diffraction intensity I (002) of hexagonal (002) face by X-ray diffraction using CuKα ray is I (002)/I (200), the I (002)/I (200) is 0.30 or more and 0.50 or less, and a ratio c/a between a-axis and c-axis of hexagonal crystal by X-ray diffraction using CuKα ray is 1.018 to 1.029.

By the composite tungsten oxide film satisfying the above requirements by X-ray diffraction analysis, the composite tungsten oxide film exerting a thermal insulating function by reflecting infrared rays, while maintaining an excellent visible light transmissivity, is achieved.

At this time, in one embodiment of the present invention, the element M may be one or more elements selected from Cs, Rb, K, Tl and Ba.

By selecting the element M from the above elements, the composite tungsten oxide film having a function to shield higher infrared rays by reflecting higher infrared rays, is achieved.

In addition, in one embodiment of the present invention, the composite tungsten oxide film is having a film thickness thicker than 20 nm.

By having such film thickness, the composite tungsten oxide film having high infrared reflecting function, is achieved.

Other embodiment of the present invention is a film-deposited base material in which the composite tungsten oxide film is deposited on at least one surface of a base material to be subjected to film deposition.

By providing the film-deposited base material in which the composite tungsten oxide film is deposited, it may be in a form provided for practical use having a mechanical characteristic and a workability.

At this time, in other embodiment of the present invention, the base material to be subjected to film deposition may be having a thermal deformation temperature or a softening point of 400° C. or more.

By having such features, it may be the film-deposited base material having more excellent functions, by a heat treatment after the film deposition.

In addition, in other embodiment of the present invention, the base material to be subjected to film deposition may be a glass.

By selecting a glass as the base material to be subjected to film deposition, an infrared shielding function can be given to an equipment using a glass used in a wide fields such as a glass window of a window for a vehicle or a window for a building, a glass fiber, a glass for a solar power generation, a glass for a display, a glass for a lens or a mirror, a glass substrate used for a semiconductor, MEMS, or the like.

In addition, other embodiment of the present invention is an article comprising one or more of the composite tungsten oxide film and/or the film-deposited base material.

According to other embodiment of the present invention, the article having low environmental load at the time of production and capable of reducing energy is provided for various use inexpensively in large quantities.

Further, other embodiment of the present invention is a method for producing a composite tungsten oxide film comprising: a film deposition process for deposition of a film by a physical film deposition method; and a heat treatment process for heat-treating the film, wherein the film is deposited in an inert gas in the film deposition process, and also, the film is heat-treated at a temperature of 400° C. to 700° C. in an inert gas containing a reducing gas or in an inert gas in the heat treatment process.

According to such production method, the composite tungsten oxide film having the above features, which is having high quality and a uniform thickness, is produced easily with an existing general production facility with high productivity and stability.

According to the present invention, a composite tungsten oxide film as an infrared reflecting film having both of a reflectivity in an infrared light region and a transparency in a visible light region, is provided. In addition, such composite tungsten oxide film is provided by a physical production method, in which used raw materials are excellent for a long-time storage and not limited at the time of a transportation or a storage of dangerous substances, by a relatively harmless method at the time of a film deposition, which is widely used industrially.

DETAILED DESCRIPTION OF THE INVENTION

Figure 1:
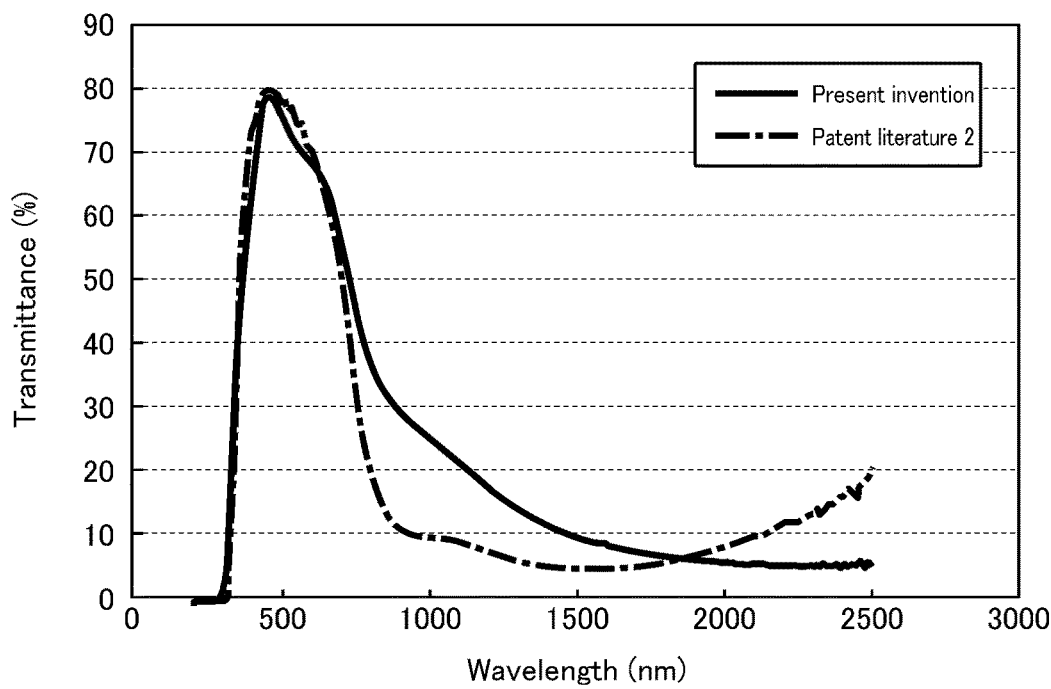
FIG. 1 is a view illustrating a difference between an optical characteristic (transmittance) of a composite tungsten oxide film of the present invention and an infrared shielding material fine particle dispersion described in Patent Literature 2.

Hereinafter, explaining about a composite tungsten oxide film and a method for producing same in the following order. In addition, the present invention should not be limited by the following examples, and it can be modified optionally within a scope not deviating from a gist of the present invention.

1. Composite tungsten oxide film
2. Method for producing composite tungsten oxide film
   2-1. Film deposition process
   2-2. Heat treatment process
3. Film-deposited base material
4. Article <1. Composite Tungsten Oxide Film>

Explaining about a composite tungsten oxide film relating to one embodiment of the present invention. A composite tungsten oxide film relating to one embodiment of the present invention is a film comprising a composition represented by a general formula $M_xW_yO_z$ (wherein, an element M is one or more elements selected from alkaline metal, alkaline earth metal, Fe, In, Tl, and Sn, an element W is tungsten, and an element O is oxygen) as main components, wherein a ratio of x and y is composed in a range of $0.001 \leq x/y \leq 1$, and a ratio of z and y is composed in a range of $2.2 \leq z/y \leq 3.0$.

About a detail of a composition range, it is described in detail in Patent Literature 2 filed by the present applicant, and it is necessary to comprise a composite tungsten oxide within this composition range as main component, in order to provide a film having high transparency and infrared light absorbing property. A basic optical characteristic of the composite tungsten oxide film is derived from an atomic arrangement of the element M, tungsten W and oxygen O, which is calculated theoretically. On the other hand, one embodiment of the present invention is the composite tungsten oxide film having different characteristic from the infrared shielding body described in Patent Literature 2, and in below, it is explained in detail by comparing the present invention with the invention relating to Patent Literature 2 accordingly.

The element M of the composite tungsten oxide film relating to one embodiment of the present invention is one or more elements selected from alkaline metal, alkaline earth metal, Fe, In, Tl, and Sn, more preferably, one or more elements selected from Cs, Rb, K, Tl, In, Ba, Li, Na, Ca, Sr, Fe, and Sn. This range is narrower than constituent elements described in Patent Literature 2, but this only indicates elements in which an effect is confirmed by examples, so the elements described in Patent Literature 2 not included in the present invention may at least have a similar function.

It is more preferable that the element M of the composite tungsten oxide film relating to one embodiment of the present invention is one or more elements selected from Cs, Rb, K, Tl, and Ba. By selecting the element M from the above elements, the composite tungsten oxide film becomes a crystal structure containing a hexagonal crystal as described in later. In addition, the element M may become the crystal structure other than the hexagonal crystal by a ratio of x/y. For example, in case of K, a ratio of x/y will be 0.5 or more and it will be a tetragonal crystal. The structure containing a hexagonal crystal phase is having higher reflection in an infrared region, so it is reflected efficiently.

In the composite tungsten oxide film relating to one embodiment of the present invention, in the general formula $M_xW_yO_z$, an atomic ratio x/y of the element M and W (tungsten) is 0.001≤x/y≤1, and an atomic ratio z/y of O (oxygen) and W (tungsten) is 2.2≤z/y≤3.0. When x/y is less than 0.001, a sufficient amount of free electrons will not be generated and an infrared shielding effect cannot be obtained. In addition, when x/y is more than 1, an impurity phase will be formed in the composite tungsten oxide film. When z/y is less than 2.2, a crystal phase of $WO_2$, which is not a target, will be generated in the composite tungsten oxide film. In addition, when z/y is more than 3.0, free electrons for obtaining an infrared shielding effect will not be generated.

The composite tungsten oxide film relating to one embodiment of the present invention does not contain organic components substantially. As described in below, the composite tungsten oxide film relating to one embodiment of the present invention is deposited by a physical film deposition method, so it is not necessary to use a dispersing agent or a medium resin, or a surfactant or a solvent as the invention relating to Patent Literature 2 and Patent Literature 3. Here, organic components are not contained substantially indicates that organic components intentionally added in the production process of the film, for example a polymeric dispersing agent or the like, are not contained.

In paragraph [0060] of Patent Literature 3, a method for producing a transparent conductive film using a composite tungsten oxide is described. According to this method, it is indicated that the transparent conductive film of Patent Literature 3 can be obtained by applying a solution containing a composite tungsten compound to a base material as a starting tungsten raw material solution, and then, by heat-treating the solution in an atmosphere of any of an inert gas, a mixed gas of an inert gas and a reducing gas, and a reducing gas. According to this method, a surfactant having a polysiloxane skeleton containing organic components is added to an ammonium metatungstate aqueous solution and a chloride aqueous solution of the element M to prepare the solution.

When the method described in Patent Literature 3 was reproduced and a surface roughness of the film was measured by a laser microscope, the surface roughness was more than 60 nm in an arithmetic mean height Sa. On the other hand, as described in below, the composite tungsten oxide film relating to one embodiment of the present invention is deposited by a physical film deposition method such as a sputtering method, so a surface roughness will be 20 nm or less. In this way, the composite tungsten oxide film relating to one embodiment of the present invention is different from the transparent conductive film of Patent Literature 3 in a smoothness.

In addition, it is indicated that a film (fine particle dispersion film) composed of a fine particle dispersion containing composite tungsten oxide fine particles of Patent Literature 2 functions as a heat ray shielding film excellent for absorption of light, especially in a near infrared region, as described in paragraphs [0050] and [0053] of Patent Literature 2.

Figure 2:
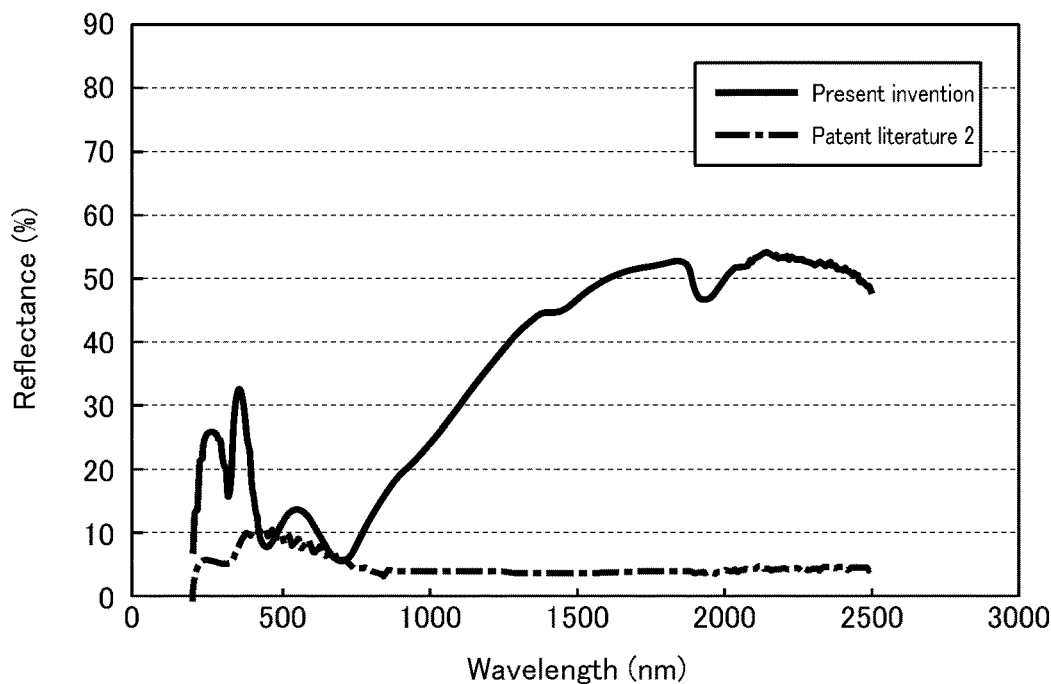
FIG. 2 is a view illustrating a difference between an optical characteristic (reflectance) of a composite tungsten oxide film of the present invention and an infrared shielding material fine particle dispersion described in Patent Literature 2.

FIG. 1 and FIG. 2 are views illustrating a difference between an optical characteristic of a composite tungsten oxide film of the present invention and an infrared shielding material fine particle dispersion described in Patent Literature 2, and FIG. 1 is illustrating about a transmittance, and FIG. 2 is illustrating about a reflectance. As illustrated in FIG. 1 and FIG. 2, the composite tungsten oxide film relating to one embodiment of the present invention indicates an optical characteristic different from an optical characteristic of the film (fine particle dispersion film) composed of the fine particle dispersion described in Patent Literature 2. Especially, as illustrated in FIG. 2, the composite tungsten oxide film relating to one embodiment of the present invention reflects light in infrared region equal to or more than 1400 nm greatly. It is assumed that this is also caused by a difference between a fine particle dispersion film and a continuous film as described in below, but its detail is still unknown.

In the composite tungsten oxide film relating to one embodiment of the present invention, a transmittance in a wavelength of 550 nm is 50% or more, a transmittance in a wavelength of 1400 nm is 30% or less, and also, a reflectance in a wavelength of 1400 nm is 35% or more.

It can be used according to use even if a transmittance in a wavelength of 550 nm, which is used as an index of transparency, is lower than 50%. For example, in a window film for a vehicle, it is preferable that a window of rear sheet is in black or dark gray from a point of view of protecting privacy, and a pigment may be used intentionally in addition to a heat ray shielding material.

An index of transparency in the present invention indicates a characteristic of the film in a state which does not contain pigment or the like, which was used intentionally in the above. When an index of transparency is lower than the above value, a lighting will be poor, and for example a room will be dark, and as a result, an outside scene may be hard to see.

Similarly, it can have a configuration that a transmittance in a wavelength of 1400 nm and a reflectance in a wavelength of 1400 nm do not satisfy the above values, indicated as an index for a shielding performance and a reflecting performance of light, but in these cases, a transmission of an infrared light will be high, and leads to a rise of a room temperature and a scorched feeling of skin in a heat shielding, and leads to a decrease in a quantity of generated heat in a photothermal conversion.

In addition, a reflection of the present invention is a reflection by free electrons, so it reflects light equal to or less than a plasma frequency. In other words, it reflects light in a wavelength equal to or more than a wavelength corresponding to a plasma frequency. That is, when a reflectance in a wavelength of 1400 nm is low, a reflectance of far infrared rays having longer wavelength will also be low, and a thermal insulating property will be low, so an effect to enclose heat such as a heating in a room will be low. It is necessary that a reflectance in a wavelength of 1400 is 35% or more, in order to obtain an effective thermal insulating property.

A surface roughness Sa of the composite tungsten oxide film relating to one embodiment of the present invention is 20 nm or less. In an optical thin film design (when laminating films), it could be used to prevent reflection in a visible light region, or it could be a steep transmission profile (adjustment of color of film) by strengthening or weakening a reflection of a certain wavelength by using interference. Regarding an effect by a surface roughness, in the optical thin film design (when laminating films), a stable laminated film with low disturbance in an optical light path is achieved as the surface roughness is small. As described in below, the composite tungsten oxide film relating to one embodiment of the present invention is a film deposited by a physical method obtained by a film deposition by a sputtering method or the like, so a surface roughness Sa of the film will be 20 nm or less. When the surface roughness is 20 nm or less, a possibility of occurring an issue in an optical thin film design will be low. When the surface roughness is more than 20 nm, it will not be a uniform laminated state, so it is difficult to obtain an effect of an optical thin film design (lamination).

In addition, the composite tungsten oxide film relating to one embodiment of the present invention is preferably formed in a film thickness of more than 20 nm. As described in below, the composite tungsten oxide film relating to one embodiment of the present invention is a film deposited by a physical method obtained by a film deposition by a sputtering method or the like, and for example in a film deposited by a heat treatment after applying a solution described in Patent Literature 3, it is formed by volatilizing a component of a solvent, a resin or the like which will be necessary for a film deposition, so a residual stress will be generated to a film accordingly. In addition, a defect may be inhered such as a residue of volatile component or a void. The composite tungsten oxide film relating to one embodiment of the present invention is deposited without containing a volatile component, so a residual stress of the film according to the film deposition becomes small, and also, a defect such as a residue of volatile component or a void does not occur. Therefore, a film without a crack or an exfoliation is formed.

However, when a film thickness of the composite tungsten oxide film is 20 nm or less, a sufficient reflecting performance in an infrared region cannot be obtained, and an infrared transmittance in a wavelength of 1400 nm will be more than 30%. In the present invention, there is no particular limit to an upper limit of a film thickness, as long as it is a thickness more than the above film thickness. However, when a film thickness becomes too thick, a transmittance in a visible light region in a wavelength of 550 nm will be less than 50%, and there may be a case that a visible light transmissivity will be deteriorated, or an exfoliation of a film occurs by an effect of a residual stress at the time of film deposition. A transmittance of a film can be measured by using a spectrophotometer.

In the composite tungsten oxide film relating to one embodiment of the present invention, a sheet resistance is less than $1.0*10^5$ ohms per square, more preferably, a sheet resistance is less than $1.0*10^3$ ohms per square. When a sheet resistance of the film is more than the above value, a reflection by free electrons will be weak, and it will not be possible to reflect far infrared rays in longer wavelength region, so a thermal insulating property is not obtained. A sheet resistance can be adjusted by the following conditions of a film deposition and a heat treatment. A sheet resistance can be measured by using, for example a resistivity meter.

In addition, the composite tungsten oxide film relating to one embodiment of the present invention is normally deposited as a continuous film, but it can be in any kind of form as long as it is having features of the present invention, even if it is in a form applied with a reflection control by patterning, or a form applied with a lens function by providing an unevenness.

It is preferable that the composite tungsten oxide film relating to one embodiment of the present invention contains a hexagonal crystal structure. It is possible to know that it contains a hexagonal crystal structure by an X-ray diffraction analysis. The composite tungsten oxide is known for a crystal structure such as hexagonal crystal, cubical crystal, tetragonal crystal, or orthorhombic crystal, and for a non-crystalline structure, but the composite tungsten oxide film relating to one embodiment of the present invention comprises a hexagonal crystal structure, and it may contain a crystal structure other than hexagonal crystal such as cubical crystal, tetragonal crystal, or orthorhombic crystal, and a non-crystalline structure. A hexagonal crystal phase is having higher reflection in an infrared region, so it is reflected efficiently, by containing a hexagonal crystal structure in the composite tungsten oxide film.

In addition, in the composite tungsten oxide film relating to one embodiment of the present invention, it is preferable that a ratio c/a between a-axis length and c-axis length of hexagonal crystal by X-ray diffraction using CuKα ray is 1.018 to 1.029. According to an ICDD reference code 01-081-1244 of a crystal structure data base, c/a is 1.028. When atoms become excessive or deficit with respect to a standard hexagonal crystal structure, it is considered that a-axis length or c-axis length changes.

In addition, in the composite tungsten oxide film relating to one embodiment of the present invention, when an intensity ratio between a diffraction intensity I (200) of hexagonal (200) face and a diffraction intensity I (002) of hexagonal (002) face by X-ray diffraction using CuKα ray is I (002)/I (200), the I (002)/I (200) is preferably 0.30 or more and 0.50 or less. In the ICDD reference code 01-081-1244, it is described that a relative intensity of (002) face with respect to (200) face is 26.2%, so a standard intensity ratio I (002)/I (200) is 0.26. An intensity ratio of a composite tungsten oxide film produced by a coating and firing method is in this standard value, but an intensity ratio of the present invention is 0.30 or more and 0.50 or less. The intensity ratio of the present invention is higher than the standard intensity ratio, so it is considered that it tends to be c-axis oriented as growth of a, b-axes of hexagonal crystal is suppressed. When the c/a is out of the range of 1.018 to 1.029, and when the intensity ratio I (002)/I (200) is out of the range of 0.30 or more and 0.50 or less, a heat ray reflecting function will be deteriorated.

In addition, when the element M is Sn, a crystal structure is a trigonal crystal, and in the X-ray diffraction, a ratio c/a between a-axis length and c-axis length of hexagonal crystal is calculated by a ratio 2c/a between a-axis length and c-axis length of trigonal crystal.

It is considered that a relation of a heat ray reflecting function and such crystal state different from a standard is peculiar to a sputtering method or a vacuum deposition method. It is considered that it is caused by a process of forming a crystal structure by a heat treatment after a deposition of a non-equilibrium and non-crystalline film, but a detail of its mechanism is unknown.

From the above, according to the composite tungsten oxide film relating to one embodiment of the present invention, the composite tungsten oxide film as an infrared reflecting film having both of a reflectivity in an infrared light region and a transparency in a visible light region, and also, having features different from a composite tungsten oxide film described in Patent Literature 2 and Patent Literature 3, is provided.

<2. Method for Producing Composite Tungsten Oxide Film>

Figure 3:
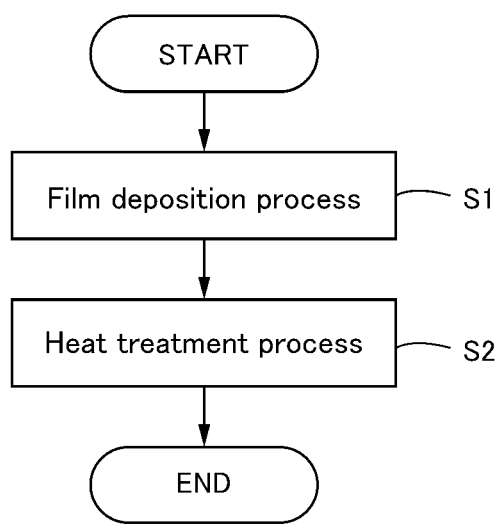
FIG. 3 is a flow chart illustrating an outline of a process in a method for producing a composite tungsten oxide film relating to one embodiment of the present invention.

Next, explaining about a method for producing a composite tungsten oxide film. FIG. 3 is a flow chart illustrating an outline of a method for producing a composite tungsten oxide film relating to one embodiment of the present invention. One embodiment of the present invention is a method for producing a composite tungsten oxide film comprising an element M, tungsten W, and oxygen O as main components, the method comprising: a film deposition process S1 for deposition of a film by a physical film deposition method; and a heat treatment process S2 for heat-treating the film. Hereinafter, explaining in detail about each process.

(2-1. Film Deposition Process)

In a film deposition process S1, a film is deposited by using a physical film deposition method. As a physical film deposition method of a composite tungsten oxide film relating to one embodiment of the present invention, there are a vacuum deposition method, a sputtering method, an ion plating method, an ion beam method and the like. Among them, the sputtering method is capable of controlling a film thickness and a film quality with high accuracy, as a film deposition process is stable, as a film deposition is dense and a film quality is strong, and as an energy of film deposition particles is high and an adhesion force is strong. Further, the sputtering method is preferable as it is capable of film deposition of metals, alloys, and compounds having high melting point, and capable of film deposition of oxides, nitrides or the like by introducing a reactive gas, and having a feature that an adjustment of a composition is relatively easy, and often used in a wide range of fields such as general purpose articles of a window film or a mirror, and electronic devices such as a liquid crystal display element or a hard disc, and as there are many production apparatuses.

A sputtering target for deposition of a composite tungsten oxide film represented by a general formula $M_xW_yO_z$ can be selected from various configurations, for example a sputtering target composed of an element M and an element W, a sputtering target composed of an element M and an compound of an element W and an element O, a sputtering target composed of an element W and a compound of an element M and an element O, and a sputtering target composed of a compound of an element M, an element W and an element O. It is preferable to use a sputtering target previously formed as a compound phase. When a sputtering target is previously formed as a compound phase, dependency of a film composition by a difference in a vapor pressure of each element can be reduced, and a stable film deposition will be possible.

The sputtering target may be in a form of, for example a sintering body formed by sintering the sputtering target composition, or a green compact formed by compacting a powder composed of particles of the sputtering target composition.

In addition, the sputtering target is formed in a sintering body or a green compact as described in the above, so it does not contain organic components substantially, and a film deposited by using the sputtering target also does not contain organic components substantially. Here, "does not contain substantially" indicates that it does not contain components added intentionally, for example a polymeric dispersing agent or the like.

When the sputtering target is, for example a conductor with a specific resistance of 1 ohm per cm or less, a DC sputtering device with high productivity can be used. In addition, when a sputtering target is, for example a sintering body with a relative density of 70% or more, a crack by a vibration at the time of transportation is decreased, and it will be in a form more suitable for an industrial production as it will not be necessary to take an extreme care for handling at the time of attachment to the device or the like.

An atmosphere of the film deposition process can be selected variously, but an inert gas atmosphere is preferable. As an inert gas, for example, a rare gas such as a helium gas or an argon gas, a nitrogen gas or the like can be used, but when it is a nitrogen gas, nitrides may be formed according to a selected element M, so it is preferable to use an argon gas, which is generally used and easily available. A purity of a gas used is preferably 99% or more, and a mixing of an oxidizing gas such as oxygen is preferably less than 1%. Some details are unknown, but when a film is deposited in an inert atmosphere and heat-treated in conditions described in below, a composite tungsten oxide film with high reflectance is obtained. On the other hand, when a ratio of an oxidizing gas is more than 1%, a reflectance of a composite tungsten oxide film after heat treatment will be decreased.

A film after the film deposition is normally non-crystalline, but a diffraction peak based on a crystal may appear at the time of X-ray diffraction analysis.

(2-2. Heat Treatment Process)

Next, in a heat treatment process S2, the film obtained in the film deposition process S1 is heat-treated. In order to obtain film characteristics of the composite tungsten oxide film relating to one embodiment of the present invention, the heat treatment process S2 is performed in an inert or a reducing atmosphere.

In the heat treatment process S2, a heat treatment temperature is preferably 400° C. to 700° C. When the heat treatment temperature is less than 400° C., the film remains to be non-crystalline and not crystallized, or even if it is crystallized, a diffraction peak of hexagonal crystal in X-ray diffraction will be extremely weak, and a heat shielding property in an infrared region will be low. In addition, even if the heat treatment temperature is more than 700° C., the features of the film of the present invention can be obtained, but practical defects occurs, such that the film and the base material react to each other, the film exfoliates from the base material, or a surface roughness will be increased.

In any of the above heat treatment temperatures, as a heat treatment time, it is sufficient to secure a time to the extent that a crystallization of composite tungsten oxides will be completed, and it may be adjusted accordingly from about 5 to 60 minutes.

As mentioned in the above, the heat treatment process S2 is performed in an inert or a reducing atmosphere. As the inert atmosphere, for example, there are nitrogen and argon, and as the reducing atmosphere, for example, there are a mixing gas of nitrogen and hydrogen, and a mixing gas of argon and hydrogen.

From the above, according to the method for producing the composite tungsten oxide film relating to one embodiment of the present invention, the composite tungsten oxide film having the above features is provided by a physical production method without a limitation at the time of a transportation and excellent for a long time storage of raw materials used, and further, by a relatively harmless method at the time of a film deposition, which is widely used industrially.

<3. Film-Deposited Base Material>

A film-deposited base material relating to one embodiment of the present invention is a base material in which the composite tungsten oxide film is deposited on at least one surface of a base material to be subjected to film deposition. The base material to be subjected to film deposition is not limited particularly, as long as the composite tungsten oxide film relating to one embodiment of the present invention can be deposited.

The base material to be subjected to film deposition is preferably a base material having a thermal deformation temperature or a softening point of 400° C. or more, as the heat treatment temperature of the film after a film deposition is 400° C. or more. When a base material having a thermal deformation temperature or a softening point of less than 400° C. is used, there will be problems such that a crack is generated at the film and the film exfoliates from the base material to be subjected to film deposition at the time of heat treatment. Preferably, a thermal expansion coefficient of the base material to be subjected to film deposition is close to a thermal expansion coefficient of the film. However, when the film is used by exfoliating the film from the base material, it is not always necessary to be the above condition, and for example, it may be the base material melting at 400° C. or less.

As the base material to be subjected to film deposition having a thermal deformation temperature or a softening point of 400° C. or more, there are a glass, ceramics, a monocrystal and the like. It is not necessary that the base material to be subjected to film deposition is always transparent, but when using the composite tungsten oxide film of the present invention together with the base material, a transparent base material is required. As the transparent base material, for example, there are a glass, transparent ceramics such as YAG or $Y_2O_3$, and a monocrystal such as sapphire. Among them, from a point of view of an easy availability, an inexpensiveness, a weatherability, a chemical resistance and the like, it is preferable to use a glass having a softening point of 400° C. or more as the base material to be subjected to film deposition.

In addition, the features of the present invention are not impaired even if the base material is having a curved surface or an uneven surface, and not a plane surface, so the base material may be selected variously.

From the above, according to the film-deposited base material relating to one embodiment of the present invention, the film-deposited base material comprising an infrared reflecting film having both of a reflectivity in an infrared light region and a transparency in a visible light region, is provided.

<4. Article>

An article relating to one embodiment of the present invention is having one or more of the composite tungsten oxide film and/or the film-deposited base material. The article relating to one embodiment of the present invention may be any article as long as it is an article in which the composite tungsten oxide film is having a light reflecting function.

In addition, even if the composite tungsten oxide film and/or the film-deposited base material of the present invention is used together with, for example a film or particles having other functions, it is included in the article using the functions described in the present invention.

The composite tungsten oxide film of the present invention is an infrared reflecting film having a reflectivity in an infrared light region, but as the article having a function to shield light by reflecting light, for example, there is a heat-shielding glass. The heat-shielding glass is having a feature to shield and insulate heat even if it is transparent, and it reduces a temperature rise in a vehicle or a temperature rise in a room by a solar light in summer. In addition, it also reflects heat of a heating in winter to confine heat in a room.

From the above, according to the article relating to one embodiment of the present invention, the article comprising the composite tungsten oxide film having both of a reflectivity in an infrared light region and a transparency in a visible light region, or such film-deposited base material, is provided.

EXAMPLES

Hereinafter, explaining about the present invention concretely using examples, but the present invention is not limited to the examples in below.

Example 1

In example 1, a cesium tungsten oxide powder (YM-01 made by SUMITMO METAL MINING CO., LTD.), in which an atomic ratio of Cs/W is 0.33, was charged into a hot-pressing device, and sintered in a condition of a vacuum atmosphere, a temperature of 950° C., and a pressing pressure of 250 kgf/cm$^2$, and a cesium tungsten oxide sintered body was prepared. As a result of chemical analysis of a composition of the sintered body, Cs/W was 0.33. This oxide sintered body was grinded by mechanical machining to a diameter of 153 mm and a thickness of 5 mm, and it was bonded to a backing plate made of stainless steel by using a metal indium brazing material, and a cesium tungsten oxide sputtering target was prepared.

Next, this sputtering target was mounted to a DC sputtering device (SBH2306 made by ULVAC, Inc.), and a cesium tungsten oxide film was deposited on a glass substrate (EXG made by Corning Inc., thickness of 0.7 mm) in a condition that an ultimate vacuum was $5*10^{-3}$ Pa or less, an atmosphere at the time of film deposition was an argon gas atmosphere, a pressure of the gas was 0.6 Pa, and an input power was 600 W in direct current (film deposition process S1). A film thickness after the film deposition was 100 nm. A structure of the deposited film was examined by using an X-ray diffraction device (X'Pert-PRO (made by PANalytical)). The deposited film was having a non-crystalline structure in which a diffraction peak derived from a crystal structure was not confirmed.

The deposited film was charged into a lamp heating furnace (HP-2-9 made by YONEKURA MFG Co., Ltd.), and heat-treated for 30 minutes at a temperature of 500° C. in a nitrogen atmosphere (heat treatment process S2). As a result of chemical analysis of this film after the heat treatment, an atomic ratio x/y of Cs/W was 0.33.

A structure of the film after the heat treatment was examined by examining a crystal structure, an X-ray diffraction intensity ratio, and a ratio c/a between a-axis and c-axis using the X-ray diffraction device (X'Pert-PRO (made by PANalytical)). A transmittance and a reflectance were measured by using a spectrophotometer (made by Hitachi, Ltd., model number: V-670).

In the film after the heat treatment, the crystal structure was a structure containing a hexagonal crystal. The X-ray diffraction intensity ratio was 0.401, and the ratio c/a between a-axis and c-axis was 1.028. In addition, a transmittance in a wavelength of 550 nm was 71.3%, a transmittance in a wavelength of 1400 nm was 11.3%, and a reflectance in a wavelength of 1400 nm was 44.5%.

As a result of measurement by using a resistivity meter (Loresta made by Mitsubishi Chemical Corporation), a sheet resistance of the film after the heat treatment was $3.0*10^3$ ohms per square, and the film after the heat treatment was a film having low resistance and high electric conductivity. (For a measurement of a resistance, Loresta or Hiresta made by Mitsubishi Chemical Corporation was used according to a resistivity.)

In addition, a surface roughness of the film after the heat treatment was measured by using a laser microscope (OLS4100 made by Olympus Corporation), and an arithmetic mean height (surface roughness) Sa was 8 nm.

Examples 2 to 17 and Comparative Examples 1 to 13

A composite tungsten oxide film was prepared by using same device as the example 1, and by changing an element M, a composition ratio, a film thickness, a film deposition atmosphere, a heat treatment atmosphere, a temperature and a time as described in Table 1 and Table 2, and the features of the film were examined. Results of examples are indicated in Table 1 and Table 2, together with results of comparative examples.

TABLE 1

| | Element M | Film deposition system | Oxygen amount at the time of film deposition (%) | Film thickness (nm) | x/y of film (M/W) | Heat treatment Atmosphere | Temperature (°C.) | Time (min) | Transmittance (%) Wavelength 550 nm | Wavelength 1400 nm |
|---|---|---|---|---|---|---|---|---|---|---|
| Example 1 | Cs | Sputtering | 0 | 100 | 0.33 | $N_2$ | 500 | 30 | 71.3 | 11.3 |
| Example 2 | Cs | Sputtering | 0 | 100 | 0.33 | $N_2$ | 600 | 30 | 73.8 | 10.5 |
| Example 3 | Cs | Sputtering | 0 | 200 | 0.33 | $N_2$ | 500 | 30 | 61.8 | 3.5 |
| Example 4 | Cs | Sputtering | 0 | 100 | 0.33 | 1% hydrogen - nitrogen | 500 | 30 | 72.5 | 11.9 |
| Comparative example 1 | Cs | Sputtering | 0 | 100 | 0.33 | $N_2$ | 300 | 30 | 75.4 | 72.7 |
| Comparative example 2 | Cs | Sputtering | 0 | 100 | 0.33 | $N_2$ | 800 | 30 | Film is lost by exfoliation | |
| Comparative example 3 | Cs | Sputtering | 5 | 100 | 0.33 | $N_2$ | 500 | 30 | 78.9 | 50.4 |
| Comparative example 4 | Cs | Sputtering | 5 | 400 | 0.33 | $N_2$ | 500 | 30 | 65.2 | 6.9 |
| Comparative example 5 | Cs | Sputtering | 5 | 400 | 0.33 | 1% hydrogen - nitrogen | 500 | 30 | 60.5 | 1.9 |
| Comparative example 6 | Cs | Sputtering | 0 | 100 | 0.33 | Atmospheric air | 500 | 10 | 87.4 | 75.2 |
| Comparative example 7 | Cs | Sputtering | 0 | 20 | 0.33 | $N_2$ | 600 | 30 | 87.7 | 74.3 |
| Example 5 | Cs | Sputtering | 0 | 100 | 0.39 | $N_2$ | 600 | 30 | 71.5 | 13.0 |
| Comparative example 8 | Cs | Sputtering | 5 | 400 | 0.39 | $N_2$ | 600 | 30 | 67.9 | 9.1 |
| Comparative example 9 | Cs | Sputtering | 5 | 400 | 0.39 | 1% hydrogen - nitrogen | 500 | 30 | 65.8 | 13.4 |
| Comparative example 10 | Cs | Sputtering | 0 | 200 | 0.39 | Atmospheric air | 500 | 10 | 69.9 | 20.7 |

| | Reflectance (%) Wavelength 1400 nm | Sheet resistance (ohm per square) | Crystal structure | Ratio c/a between a-axis length and c-axis length | X-ray diffraction intensity ratio I(002)/I(200) | Surface roughness Sa (nm) |
|---|---|---|---|---|---|---|
| Example 1 | 44.5 | $3.0 \times 10^3$ | Contains hexagonal crystal | 1.028 | 0.401 | 8 |
| Example 2 | 50.9 | $2.1 \times 10^3$ | Contains hexagonal crystal | 1.024 | 0.421 | 11 |
| Example 3 | 49.0 | $1.7 \times 10^3$ | Contains hexagonal crystal | 1.028 | 0.336 | 9 |
| Example 4 | 48.1 | $9.9 \times 10^2$ | Contains hexagonal crystal | 1.027 | 0.380 | 8 |
| Comparative example 1 | 19.3 | $2.1 \times 10^{12}$ | None-crystalline | — | — | 8 |
| Comparative example 2 | | | Film is lost by exfoliation | | | |
| Comparative example 3 | 20.1 | $5.1 \times 10^{10}$ | Contains hexagonal crystal | 1.036 | 0.561 | 8 |
| Comparative example 4 | 16.8 | $1.2 \times 10^{10}$ | Contains hexagonal crystal | 1.036 | 0.405 | 9 |
| Comparative example 5 | 28.0 | $2.7 \times 10^7$ | Contains hexagonal crystal | 1.032 | 0.455 | 9 |
| Comparative example 6 | 21.2 | $8.5 \times 10^{12}$ | Contains hexagonal crystal | 1.027 | 0.503 | 8 |

TABLE 1-continued

| | | | | | | | |
|---|---|---|---|---|---|---|---|
| Comparative example 7 | 9.9 | $1.5 \times 10^5$ | Contains hexagonal crystal | 1.033 | 0.605 | 8 |
| Example 5 | 47.7 | $7.1 \times 10^3$ | Contains hexagonal crystal | 1.027 | 0.392 | 11 |
| Comparative example 8 | 21.9 | $2.5 \times 10^{11}$ | Contains hexagonal crystal | 1.035 | 0.420 | 12 |
| Comparative example 9 | 8.2 | $5.0 \times 10^8$ | Contains hexagonal crystal | 1.032 | 0.484 | 9 |
| Comparative example 10 | 19.4 | $7.5 \times 10^{13}$ | Contains hexagonal crystal | 1.028 | 0.526 | 9 |

TABLE 2

| | Element M | Film deposition system | Oxygen amount at the time of film deposition (%) | Film thickness (nm) | x/y of film (M/W) | Heat treatment Atmosphere | Temperature (° C.) | Time (min) | Transmittance (%) Wavelength 550 nm | Transmittance (%) Wavelength 1400 nm |
|---|---|---|---|---|---|---|---|---|---|---|
| Example 6 | Cs | Sputtering | 0 | 200 | 0.15 | $N_2$ | 600 | 30 | 65.4 | 4.5 |
| Comparative example 11 | Cs | Sputtering | 5 | 400 | 0.15 | $N_2$ | 600 | 30 | 62.1 | 10.9 |
| Comparative example 12 | Cs | Sputtering | 5 | 400 | 0.15 | 1% hydrogen - nitrogen | 600 | 30 | 58.5 | 4.5 |
| Comparative example 13 | Cs | Sputtering | 0 | 200 | 0.15 | Atmospheric air | 500 | 10 | 69.0 | 23.0 |
| Example 7 | Rb | Sputtering | 0 | 200 | 0.33 | $N_2$ | 500 | 30 | 70.7 | 11.0 |
| Example 8 | Tl | Sputtering | 0 | 300 | 0.33 | $N_2$ | 500 | 30 | 69.2 | 11.1 |
| Example 9 | K | Sputtering | 0 | 400 | 0.33 | $N_2$ | 500 | 30 | 65.4 | 12.0 |
| Example 10 | Ba | Sputtering | 0 | 400 | 0.33 | $N_2$ | 500 | 30 | 59.8 | 12.1 |
| Example 11 | Na | Sputtering | 0 | 300 | 0.5 | $N_2$ | 500 | 30 | 62.6 | 10.0 |
| Example 12 | Na | Sputtering | 0 | 200 | 0.75 | $N_2$ | 500 | 30 | 50.9 | 7.0 |
| Example 13 | K | Sputtering | 0 | 300 | 0.55 | $N_2$ | 500 | 30 | 64.0 | 9.1 |
| Example 14 | In | Sputtering | 0 | 500 | 0.33 | $N_2$ | 500 | 30 | 56.4 | 11.6 |
| Example 15 | Sn | Sputtering | 0 | 600 | 0.33 | $N_2$ | 500 | 30 | 50.6 | 9.5 |
| Example 16 | Na | Sputtering | 0 | 200 | 0.33 | $N_2$ | 500 | 30 | 60.8 | 10.5 |
| Example 17 | Rb | Sputtering | 0 | 300 | 0.25 | $N_2$ | 500 | 30 | 67.6 | 10.7 |

| | Reflectance (%) Wavelength 1400 nm | Sheet resistance (ohm per square) | Crystal structure | Ratio c/a between a-axis length and c-axis length | X-ray diffraction intensity ratio I(002)/I(200) | Surface roughness Sa (nm) |
|---|---|---|---|---|---|---|
| Example 6 | 48.7 | $3.0 \times 10^3$ | Contains hexagonal crystal | 1.021 | 0.425 | 11 |
| Comparative example 11 | 16.1 | $1.8 \times 10^{10}$ | Contains hexagonal crystal | 1.031 | 0.433 | 12 |
| Comparative example 12 | 27.3 | $3.8 \times 10^8$ | Contains hexagonal crystal | 1.032 | 0.440 | 12 |
| Comparative example 13 | 18.8 | $6.5 \times 10^{13}$ | Contains hexagonal crystal | 1.022 | 0.511 | 9 |
| Example 7 | 48.4 | $1.4 \times 10^3$ | Contains hexagonal crystal | 1.024 | 0.432 | 8 |
| Example 8 | 47.5 | $1.4 \times 10^3$ | Contains hexagonal crystal | 1.018 | 0.311 | 8 |
| Example 9 | 46.9 | $6.4 \times 10^2$ | Contains hexagonal crystal | 1.026 | 0.489 | 9 |
| Example 10 | 47.6 | $6.7 \times 10^2$ | Contains hexagonal crystal | 1.022 | 0.417 | 8 |
| Example 11 | 45.2 | $6.9 \times 10^2$ | Does not contain | — | — | 9 |

TABLE 2-continued

| | | | | | | |
|---|---|---|---|---|---|---|
| Example 12 | 46.6 | $1.9 \times 10^3$ | Does not contain hexagonal crystal | — | — | 8 |
| Example 13 | 49.9 | $1.1 \times 10^3$ | Does not contain hexagonal crystal | — | — | 8 |
| Example 14 | 48.0 | $5.1 \times 10^2$ | Contains hexagonal crystal | 1.018 | 0.350 | 8 |
| Example 15 | 45.6 | $3.6 \times 10^2$ | Contains hexagonal crystal | 1.021 (2c/a) | 0.490 | 9 |
| Example 16 | 46.7 | $2.2 \times 10^3$ | Does not contain hexagonal crystal | — | — | 8 |
| Example 17 | 45.2 | $1.2 \times 10^3$ | Contains hexagonal crystal | 1.023 | 0.452 | 9 |

From Table 1 and Table 2, in the examples 1 to 17 included in the method for producing the composite tungsten oxide film relating to the present invention, it was confirmed that the film having features that a transmittance in a wavelength of 550 nm is 50% or more, a transmittance in a wavelength of 1400 nm is 30% or less, and also, a reflectance in a wavelength of 1400 nm is 35% or more, were provided. In addition, in the examples 1 to 17 included in the present invention, it was confirmed that a sheet resistance was less than $1.0*10^5$ ohms per square, and a surface roughness Sa was 20 nm or less. On the other hand, in comparative examples 1 to 13 not included in the method for producing the composite tungsten oxide film relating to the present invention, an optical characteristic was not satisfying the requirements, and also, a sheet resistance was $1.0*10^5$ ohms per square or more.

In addition, it was explained in detail about one embodiment and each example of the present invention as the above, but it is easy for those who skilled in the art to understand that various modifications are possible without substantially departing from new matters and effects of the present invention. Therefore, all of such modified examples are included within the scope of the present invention.

For example, a term used at least once in the description or drawings together with a different term that is broader or the same in meaning can also be replaced by the different term in any place in the description or drawings. Further, the configurations of the composite tungsten oxide film and the method for producing same, and also, the film-deposited base material and the article each provided with the film, are not limited to those described in one embodiment and each example of the present invention, but may be carried out in various modifications.

The composite tungsten oxide film relating to the present invention is having high transparency in a visible light region and excellent light reflectivity in an infrared region, and also, having high film smoothness, so it is having a possibility to be used in a wide range of applications by using a light reflecting function.

The invention claimed is:

1. A composite tungsten oxide film comprising a composition represented by a general formula $M_xW_yO_z$, wherein an element M is one or more elements selected from alkaline metal, alkaline earth metal, Fe, In, Tl, and Sn, an element W is tungsten, and an element O is oxygen, as a main component,
   wherein $0.001 \leq x/y \leq 1$, $2.2 \leq z/y \leq 3.0$,
   wherein a particle dispersion and organic components are not contained substantially in the composition, and
   wherein the composite tungsten oxide film is sputtered and heat treated, wherein the sputtered and heat treated composite tungsten oxide film has a transmittance in a wavelength of 550 nm of 50% or more, a transmittance in a wavelength of 1400 nm of 30% or less, and a reflectance in a wavelength of 1400 nm of 35% or more.

2. The composite tungsten oxide film according to claim 1, wherein a surface roughness Sa of the composite tungsten oxide film is 20 nm or less.

3. The composite tungsten oxide film according to claim 1, wherein a sheet resistance of the composite tungsten oxide film is less than $10^5$ ohms per square.

4. The composite tungsten oxide film according to claim 1, wherein the element M is one or more elements selected from Cs, Rb, K, Tl, In, Ba, Li, Na, Ca, Sr, Fe and Sn.

5. The composite tungsten oxide film according to claim 1, wherein the composite tungsten oxide film contains a hexagonal crystal structure.

6. The composite tungsten oxide film according to claim 5, wherein, when an intensity ratio between a diffraction intensity I (200) of hexagonal (200) face and a diffraction intensity I (002) of hexagonal (002) face by X-ray diffraction using CuKα ray is I (002)/I (200), the I (002)/I (200) is 0.30 or more and 0.50 or less, and
   a ratio c/a between a-axis and c-axis of hexagonal crystal by X-ray diffraction using CuKα ray is 1.018 to 1.029.

7. The composite tungsten oxide film according to claim 1, wherein the composite tungsten oxide film has is having a film thickness of more thicker than 20 nm.

8. A film-deposited base material, comprising wherein the composite tungsten oxide film according to claim 1 deposited on at least one surface of a base material.

9. The film-deposited base material according to claim 8, wherein the base material has a thermal deformation temperature or a softening point of 400° C. or more.

10. The film-deposited base material according to claim 8, wherein the base material is a glass.

11. An article comprising one or more of the composite tungsten oxide film according to claim 1.

12. A method for producing the composite tungsten oxide film of claim 1, comprising:
 a film deposition process for deposition of the composite tungsten oxide film by a physical film deposition method, wherein the film is deposited in an inert gas atmosphere; and
 a heat treatment process for heat-treating the deposited film, wherein the heat treatment process is at a temperature of 400° C. to 700° C. in an inert gas optionally containing a reducing gas.

13. An article comprising the film-deposited base material according to claim 8.

14. A composite tungsten oxide film comprising a composition represented by a general formula $M_xW_yO_z$, wherein an element M is one or more elements selected from alkaline metal, alkaline earth metal, Fe, In, Tl, and Sn, an element W is tungsten, and an element O is oxygen, as a main component,
 wherein $0.001 \leq x/y \leq 1$, $2.2 \leq z/y \leq 3.0$,
 wherein a particle dispersion is not contained substantially in the composition,
 wherein the composite tungsten oxide film contains a hexagonal crystal structure,
 wherein when an intensity ratio between a diffraction intensity I (200) of hexagonal (200) face and a diffraction intensity I (002) of hexagonal (002) face by X-ray diffraction using CuKα ray is I (002)/I (200), the I (002)/I (200) is 0.30 or more and 0.50 or less, and
 wherein a ratio c/a between a-axis and c-axis of hexagonal crystal by X-ray diffraction using CuKα ray is 1.018 to 1.029.

15. The composite tungsten oxide film according to claim 9, wherein, the element M is one or more elements selected from Cs, Rb, K, Tl and Ba.

16. The composite tungsten oxide film according to claim 14, wherein the composite tungsten oxide film has a film thickness thicker than 20 nm.

17. A film-deposited base material, wherein the composite tungsten oxide film according to claim 14 is deposited on at least one surface of a base material.

18. The film-deposited base material according to claim 17, wherein the base material has a thermal deformation temperature or a softening point of 400° C. or more.

19. The film-deposited base material according to claim 17, wherein the base material is a glass.

20. An article comprising one or more of the composite tungsten oxide film according to claim 8.

21. An article comprising the film-deposited base material according to claim 17.

* * * * *